United States Patent [19]

Miller

[11] Patent Number: 4,611,126

[45] Date of Patent: Sep. 9, 1986

[54] POWER ON/OFF RESET GENERATOR

[75] Inventor: Peter A. Miller, Orlando, Fla.

[73] Assignee: Werkzeugmaschinenfabrik Oerlikon-Buehrle AG, Zurich, Switzerland

[21] Appl. No.: 657,557

[22] Filed: Oct. 4, 1984

[51] Int. Cl.$^4$ .............................................. H02J 7/00
[52] U.S. Cl. ...................................... 307/64; 307/31; 307/33; 361/18; 361/89
[58] Field of Search .................. 307/20, 24, 31, 33, 307/35, 64, 66, 87, 140, 141, 297, 592, 594, 200 A, 200 B, 362, 442; 361/18, 86, 89; 364/184

[56] References Cited

U.S. PATENT DOCUMENTS

| | | | |
|---|---|---|---|
| 3,125,715 | 3/1964 | Brooks | 361/18 X |
| 3,164,754 | 1/1965 | Garland et al. | 307/362 |
| 3,174,094 | 3/1965 | Farnsworth et al. | 361/18 X |
| 3,321,747 | 5/1967 | Adamson | 340/172.5 |
| 3,337,742 | 8/1967 | Baehr et al. | 307/64 |
| 3,365,587 | 1/1968 | Baur | 307/362 X |
| 3,409,783 | 11/1968 | Baeher et al. | 307/64 |
| 3,428,820 | 2/1969 | Lyon | 307/64 |
| 3,491,264 | 1/1970 | Peterson et al. | 361/18 |
| 3,505,537 | 4/1970 | Giordano | 307/362 |
| 3,510,756 | 5/1970 | Chute | 361/18 X |
| 3,514,691 | 5/1970 | Levin et al. | 307/31 X |
| 3,539,869 | 11/1970 | Blashfield | 361/86 X |
| 3,551,746 | 12/1970 | Rubner | 361/86 X |
| 3,560,861 | 2/1971 | Milleker et al. | 328/74 |
| 3,571,604 | 3/1971 | Porta | 307/33 X |
| 3,624,489 | 11/1971 | Betton | 307/33 X |
| 3,760,230 | 9/1973 | Henderson | 307/64 X |
| 3,848,179 | 11/1974 | Kayama | 361/86 X |
| 3,937,937 | 2/1976 | McVey | 235/153 R |
| 3,950,654 | 4/1976 | Broedner et al. | 307/208 |
| 4,010,403 | 3/1977 | Ashley | 361/18 |
| 4,198,698 | 4/1980 | Ong et al. | 307/125 X |
| 4,290,119 | 9/1981 | Masuda et al. | 307/238 X |
| 4,401,901 | 8/1983 | Ochi | 307/361 |

Primary Examiner—William M. Shoop, Jr.
Assistant Examiner—Shik Luen Paul Ip
Attorney, Agent, or Firm—Julian C. Renfro

[57] ABSTRACT

A power on-off reset generator for monitoring a power supply for a logic system powered from the monitored power supply. A precision-voltage sensor produces a control signal for a time delay circuit when the power supply rises above a preselected value. A delay signal is generated which maintains an active-LOW control signal to the logic system and causes a Schmitt trigger circuit to produce a HIGH control signal to the logic system at the end of the delay signal.

12 Claims, 3 Drawing Figures

POWER ON/OFF RESET GENERATOR

BACKGROUND

1. Field of the Invention

The present invention relates to a power on/off reset generator for use with digital logic and computer systems, and more specifically to a device for inhibiting such systems for write protection and protecting such systems from false interface signals while power is being sequenced.

2. Description of the Prior Art.

When power line interruptions occur or transient conditions exist, there may be loss of data or modification of data in memory in digital data systems. Some systems have utilized battery backup to prevent memory loss, but this procedure does not protect against the effect of power surges or transients. Some military systems may require control of the logic system only during turn on and turn off, referred to as a Class 3 system, while others require that reset siganl control be provided at all times, including the system power off condition, known as a Class 4 system.

Certain counters, registers and similar circuits in computers and other logic circuits must be initialized to a preselected state whenever the supply voltage has been below some minimum value, such as occurs when power is first turned on, or during primary power failures. The circuit which detects such minimum voltage levels and generates a reset signal which is utilized by the system to perform the required initialization is referred to as a Power On Reset (P.O.R.) Generator.

Typical prior art power on reset circuits have been described in the U.S. patent to Thomas, U.S. Pat. Nos. 4,296,338 and 4,096,560 to Footh. These circuits inhibit the controlled circuits upon return of power after an interruption, but do not allow inhibition under all power supply conditions. There is a need for a power on reset circuit design which will provide inhibition under all power supply conditions. A circuit is also needed that can be implemented using integrated circuit techniques.

SUMMARY OF THE INVENTION

An improved power on-off reset generator is provided in accordance with this invention, which combines a stable voltage sensor, a time delay, a Schmitt trigger and an output driver, which provide a P.O.R. signal to the controlled logic system. Saturation mode circuit design principle is used as means to implement this improvement, wherein proper circuit operation is assured under normal and sub-normal power supply conditions.

The stable voltage sensor includes a precision threshold which does not require initial adjustment and is insensitive to rise time of the monitored power supply. For example, when a 5 volt TTL power supply is to be monitored, it is important that the sensor be set to a threshold $E_T$ very near the minimum TTL operating point of 4.5 volts. To obtain the required precision without requiring adjustment, a differential amplifier is used with precision bias resistors and a temperature compensated precision voltage reference zener diode.

When the power supply is off, the P.O.R. signal is LOW, referred to as a LOW-active signal. When the power supply is turned on and the voltage begins to rise from zero, a portion of the supply voltage is applied to the base of the first transistor of the differential amplifier and the base of the second transistor of the differential amplifier is maintained near ground. That transistor quickly saturates. The time delay circuit is implemented by a timing capacitor having a discharge transistor connected across its terminals. Saturation of the differential amplifier causes the discharge transistor to discharge any charge on the capacitor.

As the supply voltage continues to rise, it will reach the breakdown voltage of the zener diode which is connected between the base of the second transistor of the differential amplifier, and the power supply being monitored. When the zener diode conducts and the base of the second transistor has risen above the base of the first transistor, this differential amplifier will saturate in the opposite direction, cutting off the timing capacitor discharge transistor.

The timing capacitor is connected via a precision timing resistor to the power supply and will begin to charge, generating a delay ramp voltage across the capacitor. As will be understood, the zener diode is selected in accordance with the desired value of $E_T$. Therefore, the ramp will begin when $E_T$ is reached. The power supply voltage continues to rise to its normal operating level. The delay time is selected to be in accordance with the user requirements.

A second differential amplifier is provided to supply a temperature-stable threshold to sense the timing ramp. The timing ramp voltage across the timing capacitor is connected to the input transistor of the second differential amplifier. The input transistor drives the P.O.R. generator output transistor, which has positive feedback to the input. Thus, when the ramp crosses the input threshold, the output transistor produces positive feedback for a Schmitt trigger function. This causes a clear, sharp HIGH P.O.R. signal which is connected to the controlled system.

When loss of power occurs, the operation is reversed (additionally circumventing the capacitor delay) to reapply the LOW-active reset signal as soon as the supply voltage drops below $E_T$.

It is therefore a principal object of the invention to provide a stable power on or off reset circuit which will provide inhibition of the controlled system when the power supply is less than a predetermined value.

It is another object of the invention to provide a power on reset circuit having a stable precision voltage sensor, and a time delay generator controlled by the sensor, whereby selection of the threshold voltage may be reliably placed very near the nominal power supply voltage, and whereby said threshold selection may be made without requiring item-to-item selectable or adjustable components.

It is still another object of my invention to provide a POR generator having a trigger circuit producing a clean, bounce-free reset signal at the end of a delay signal from the time delay generator, regardless of the rise or fall times of the monitored supply.

It is yet another object of my invention to provide a power on reset generator which can be powered from the monitored power supply for producing an enable logic signal when the power supply voltage is within the operating range of the controlled logic circuit, and a disable logic signal when the power supply voltage is less than such voltage operating range.

It is yet still another object of my invention to provide a POR generator having the ability to detect and to react to short loss of power transients on the monitored supply voltage.

It is yet another object of the invention to provide a power on reset circuit using circuit elements that can be implemented as integrated circuits.

Other objects, features and advantages will become more apparent as the description proceeds.

DETAILED DESCRIPTION

Figure 1:
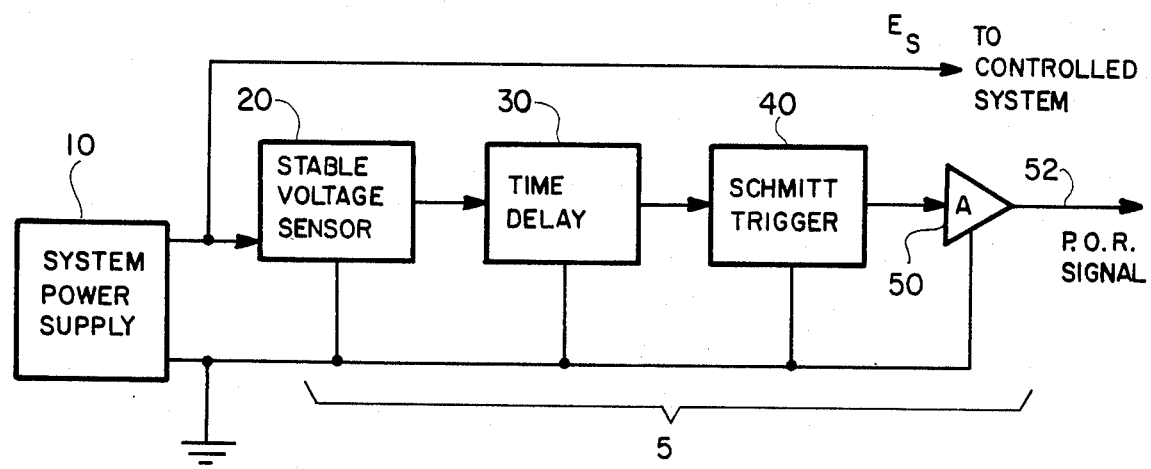
FIG. 1 is a simplified block diagram of the invention connected to a system power supply.

Referring first to the simplified block diagram of FIG. 1, the basic operation of the power on reset generator 5 may be described. System power supply 10 furnishes a normal operating voltage $E_S$ to the controlled system. The output of supply 10 is connected to stable voltage sensor 20.

Assume that power supply 10 is off and is turned on at time $t_o$. As shown in the waveform on line A of FIG. 3, the voltage will begin to rise. In FIG. 1, the voltage on P.O.R. generator lead 52 is in the LOW-active state and the protected circuits in the controlled system are inhibited. Stable voltage sensor 20 is set to respond when the power supply voltage reaches the selected threshold voltage $E_T$, shown in FIG. 3, which is the minimum for which the circuits in the controlled system are guaranteed to operate. This occurs at time $t_3$. Sensor 20 triggers time delay circuit 30, which has a delay $\tau$ selected to permit the controlled system to complete its reset process.

Figure 3:
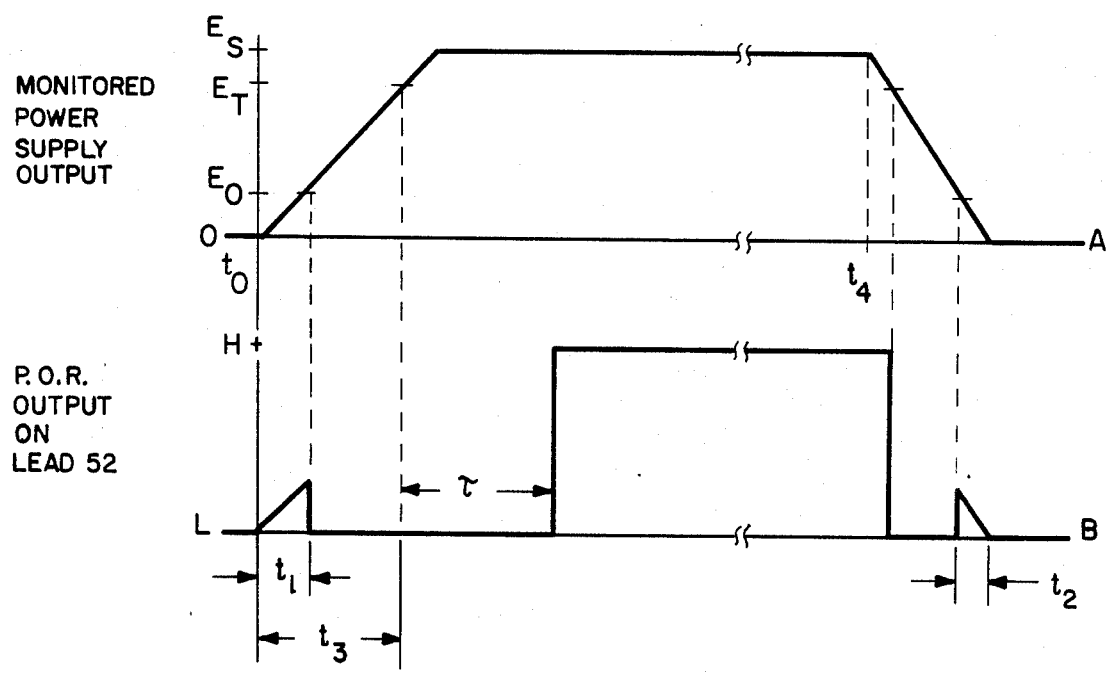
FIG. 3 is a diagram of the power supply voltage and the P.O.R. signal shown as a function of time.

At $t_3$ plus $\tau$, time delay 30 trips Schmitt trigger 40, causing driver amplifier 50 to release the active-LOW reset signal on lead 52; note Line B of FIG. 3. This HIGH on lead 52 enables the controlled system. When the power supply 10 is turned off or interrupted as at time $t_4$, the voltage sensor 20 resets Schmitt trigger 40, and produces the active-LOW reset signal on lead 52. It may be noted that, prior to the power supply 10 attaining the required $E_O$ voltage, the P.O.R. output on lead 52 will be uncontrolled in the interval $t_1$, and the power supply voltage $E_O$ is insufficient to enable the controlled systems. This same situation occurs during turn off at $t_2$.

Figure 2:
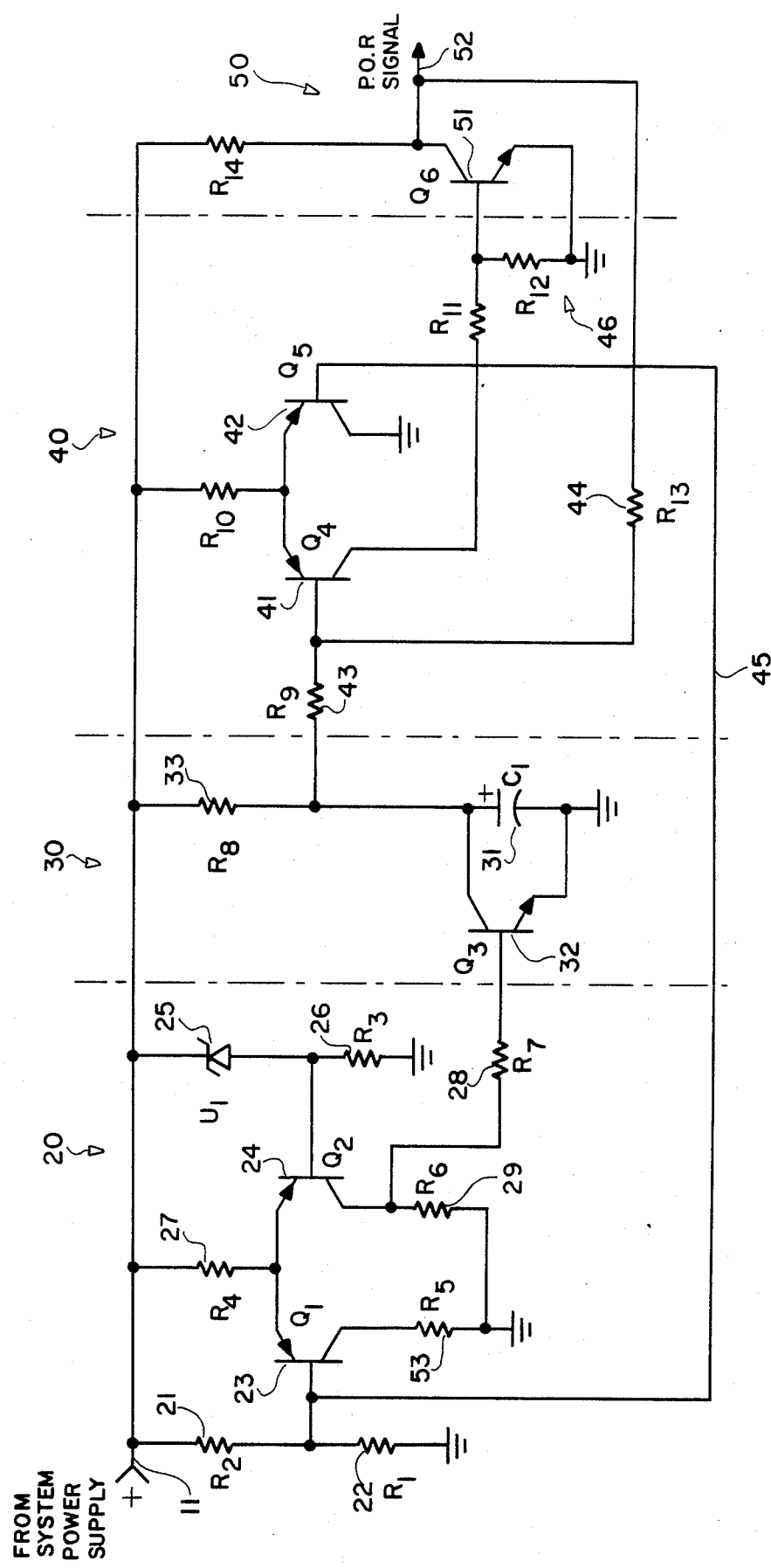
FIG. 2 is a detailed schematic diagram of the circuit of a preferred embodiment of the invention.

Turning now to FIG. 2, a circuit diagram of the power off generator is shown. Stable voltage sensor 20 is implemented by differential amplifier 23, 24 ($Q_1$, $Q_2$), hereinafter referred to as the first differential amplifier. It will be noted that the base of $Q_2$ 24 is returned to ground via resistor 26 ($R_3$) and to the power supply positive lead 11 by zener diode 25. The base of $Q_1$ 23 is biased by resistors 21, 22 ($R_2$, $R_1$). With reference to FIG. 3, resistors 21, 22 and zener diode 25 ($U_1$) are selected such that $$\frac{E_z}{1 - \frac{R_1}{R_1 + R_2}}$$

equals $E_T$, the desired threshold voltage.

$E_Z$ is the zener ($U_1$) breakdown voltage. The percentage tolerance directly relates to the $E_T$ threshold tolerance. Thus, the zener is selected to have a precision value and the P.O.R. circuit can be built without requiring adjustable or selectable components.

A typical example is a power supply for TTL circuits having an $E_S$ of 5 volts, which require a minimum $E_T$ voltage of 4.5.

When the power supply is turned on and the power supply voltage exceeds the point designated $E_O$, which is typically 0.7 volts, saturation of $Q_2$ 24 occurs, causing current flow through resistor 27 ($R_4$) and resistor 28 ($R_7$) to saturate transistor 32 ($Q_3$). To insure saturation, resistor 27 is a much smaller value than normally used for a differential amplifier.

Transistor 32 serves as a low-impedance discharge transistor for timing capacitor 31 ($C_1$), to remove any residual charge therefrom. The supply continues to rise to the point when zener 25 ($U_1$) conducts. After this zener diode 25 offset, the base voltage of $Q_2$ 24 will rise at a faster rate than the base voltage of $Q_1$ 23. When the power supply voltage has risen enough for the $Q_2$ base voltage to overtake the base voltage of $Q_1$, transistor $Q_2$ turns off and the first differential amplifier saturates in the opposite direction. Hence, the lack of voltage across resistor 29 ($R_6$) turns transistor 32 off.

As will be understood, the ability of the low impedance discharge transistor 32 to rapidly discharge capacitor 31 ensures that the circuit will detect extremely short loss-of-power transients which, if undetected, could cause operational failure in fast reaction logic circuitry.

After discharge, capacitor 31 begins to charge via precision timing resistor 33 ($R_8$). As will be understood, the charge time is controlled by the time constant $R_8C_1$. The voltage across capacitor 31 is applied to the base of transistor 41 ($Q_4$) of the second differential amplifier via resistor 43 ($R_9$). The second differential amplifier, utilizing transistors $Q_4$ and $Q_5$, in conjunction with feedback from the output driver, acts as the Schmitt trigger 40, and the voltage applied to the base of transistor $Q_4$ may be regarded as a first input to the second differential amplifier.

The threshold for the second differential amplifier is set by lead 45 connected to the junction of shared resistors 21, 22, and this may be regarded as a second input to the second differential amplifier. The output of the second differential amplifier is connected via $R_{11}$ to the base of transistor 51 ($Q_6$).

When the voltage ramp developing across capacitor 31 crosses the threshold, transistor 41 turns off. Due to the slope of the delay ramp, the turn off tends to be slow. However, as transistor 41 starts to turn off, the output of the second differential amplifier, applied to the base of transistor 51 drops, causing the collector voltage of transistor 51 to rise. The collector of $Q_6$ is connected via resistor 44 ($R_{13}$) to the base of transistor 41, thus providing the positive feedback causing the Schmitt trigger action. Resistor 43 ($R_9$) isolates this feedback from capacitor 31.

When transistor 51 turns off, a HIGH voltage level (H) occurs on lead 52, representing the desired release of the LOW-active power off reset signal.

As will now be recognized, the value of capacitor 31 is selected to obtain the desired delay. If it is desired to switch in a battery backup for a "power fail" situation, the voltage across resistor 53 ($R_5$) can be connected to a switching transistor complementary to transistor 32.

The use of output driver 50 permits direct drive of the controlled system in a power fail-safe manner without the need for buffering. The generator is powered from the supply voltage being monitored, yet provides reset control down to a small fraction of the nominal voltage. Advantageously, the circuits are insensitive to power supply rise and fall times and produce a bounce free output.

As should now be clear, the P.O.R. generator of my invention is powered from the supply it is monitoring, yet is capable of maintaining active control of the controlled logic system, even under marginal power supply conditions. For example, for silicon transistors, control down to 1.0 volts is guaranteed, but 0.7 volts is typical. This characteristic is due to the circuit of FIG. 2, which throughout utilizes current flow paths in which each path is designed to have only one base-emitter junction drop before establishing saturation. This principle is better known as saturation mode logic. For example, when the power supply is at 0.7 volts, $U_1$ is non-conducting and transistor $Q_2$ is saturated. With negligible voltage drop across the emitter-to-collector of $Q_2$, essentially the entire power supply voltage (0.7 volts) is available to the base of $Q_3$ via $R_4$, and $R_7$, thereby allowing transistor $Q_3$ also to saturate. This principle is used throughout the design of my invention. My novel circuit is free of sensitivity to the rise and fall times of the monitored power supply through the use of direct circuit coupling, use of only voltage-sensitive devices, and the action of the Schmitt trigger.

It may be noted from FIG. 2 that only transistors and resistors are utilized, with the exception of timing capacitor 31. Therefore, the circuit may be realized by monolithic integrated circuit packaging with terminals for an outboard delay capacitor which may be selected for a desired delay time.

Although a preferred embodiment has been disclosed for exemplary purposes, it is to be understood that various modifications may be made without departing from the spirit and scope of the invention as represented by the appended claims.

I claim:

1. A power on-off reset generator for monitoring a power supply for a controlled logic system comprising:
   voltage sensor means connected in parallel with said power supply for producing an output signal when the voltage of said power supply rises above a preselected value;
   time delay means connected to receive the output signal from said voltage sensor means for producing a delay signal of a preselected duration;
   trigger circuit means connected to said time delay means and responsive to the termination of said delay signal for producing a bounce-free enabling logic level reset signal, said trigger circuit producing a disabling logic level signal when said power supply voltage is less than said preselected value; and
   output driver means associated with said trigger circuit for furnishing said enabling signal and said disabling signal in a power fail-safe manner to said controlled logic system,
   each of said voltage sensor means, time delay means, trigger circuit means, and output driver means employing saturation mode circuit design principle and operating from the same power supply being monitored, and performing properly under a range of normal and subnormal power supply conditions, said range of power supply conditions for proper operation spanning from the selected nominal operating voltage of said power supply, down to 1.0 volts guaranteed, 0.7 volts typical.

2. The power on-off reset generator as recited in claim 1 in which said voltage sensor means includes:
   a temperature compensated precision-voltage zener diode having one terminal thereof connected to the power supply, and
   a first differential amplifier having a first input connected to a preselected reference voltage and a second input connected to the other terminal of said zener diode, said first differential amplifier producing said output signal,
   whereby said zener diode is selected to conduct when the power supply voltage is equal to or greater than a desired threshold.

3. The power on-off reset generator as recited in claim 2 in which said time delay means includes:
   a delay capacitor,
   a discharge transistor connected in parallel with said capacitor, said transistor controlled by said output signal from said first differential amplifier to remove a charge from said capacitor, and
   charging resistor connected to the power supply and to said capacitor for charging said capacitor.

4. The power on-off reset generator as recited in claim 1 in which said output driver means includes a driver transistor.

5. The power on-off reset generator as recited in claim 1 in which said trigger circuit means includes a Schmitt trigger.

6. The power on-off reset generator as recited in claim 5 in which said Schmitt trigger includes:
   a second differential amplifier having a first input connected to said capacitor, a second input connected to a source of reference voltage, and an output connected to the input of said driver transistor;
   a feedback connection from the output of said driver transistor to said first input of said second differential amplifier.

7. The power on-off reset generator as recited in claim 1 in which said reset generator, while operating from the same controlled logic system power supply that it is monitoring, maintains active control of the controlled logic system under said range of normal and subnormal power supply conditions, said voltage sensor means, time delay means, trigger circuit means, and output driver means comprising a circuit which throughout utilizes current flow paths in which each path has only one base-emitter junction voltage drop before a re-establishing saturation, whereby none of the recited four means requires regulation or voltage conversion of the monitored supply, nor requires a battery, or other power source.

8. The power on-off reset generator as recited in claim 1 in which said voltage sensor means, said trigger circuit means and said output driver means are implemented with resistor and transistor elements whereby the generator can be implemented as a single monolithic integrated circuit package.

9. A power on-off reset generator utilizing single base-emitter drop saturation mode principle for monitoring a power supply and controlling a logic system to be enabled when the power supply voltage is greater than a value $E_T$ and to be actively disabled when the power supply voltage is less than $E_T$ comprising:
   a first differential amplifier powered by said power supply and having a first input connected to a reference voltage divider across said power supply, said voltage divider having a resistor $R_1$ and a resistor $R_2$ whereby a reference voltage equal to $(R_1/R_1+R_2)$ times the power supply voltage is produced, a second input, and an output;

a temperature compensated precision-voltage zener diode connected from said second input of said first differential amplifier to said power supply whereby said first differential amplifier produces an output signal when the power supply voltage is equal to or greater than the breakdown voltage of said zener diode divided by $$\left(1 - \frac{R_1}{R_1 + R_2}\right);$$

a time delay capacitor connected to said power supply via a charging resistor;

a discharge transistor having an output connected in parallel with said capacitor and an input connected to said output of said first differential amplifier;

a second differential amplifier having a first input thereof connected to said capacitor, a second input connected to said first input of said first differential amplifier, and an output thereof; and a driver transistor having an input connected to said output of said second differential amplifier and an output connected to said logic system, said output also connected in positive feedback relationship to said first input of said second differential amplifier, whereby said driver transistor produces an active-LOW output when the power supply voltage is less than $E_T$ and a HIGH output when the power supply is equal to or greater than $E_T$, such use of saturation mode principle making satisfactory operation possible, even when the power supply voltage is down as low as one volt.

10. The power on-off reset generator as recited in claim 9 in which said first differential amplifier, said second differential amplifier and said driver transistor are direct coupled, thereby adapting said reset generator to be insensitive to the rise and fall times of said power supply, and said positive feedback from said output of said driver transister is connected to said first input of said second differential amplifier whereby the transistion between said active-LOW output and said HIGH output is non-oscillatory.

11. The power on-off reset generator as recited in claim 9 which is capable of guaranteed stable performance over exceedingly wide temperature extremes and also having precision threshold accuracy, comprising a voltage sensor means which employs a temperature compensated precision voltage zener diode and differential amplifier to sense the $E_T$ threshold and a trigger circuit means which employs a differential amplifier to sense the $\tau$ delay threshold, whereby the selection of $E_T$ may be reliably placed very near the nominal supply voltage in order to guarantee proper controlled logic system operation, and whereby such $E_T$ selection may be made without requiring item-to-item selectable or adjustable components.

12. The power on-off reset generator as recited in claim 9 in which said discharge transistor is adapted to have a low impedance when conducting, to thereby discharge said time delay capacitor sufficiently rapidly as to enable said reset generator to monitor and respond to short loss-of-power transients, whereby fast reaction circuitry in said logic circuit is protected.

* * * * *